US007150628B2

(12) United States Patent
Yamaga et al.

(10) Patent No.: US 7,150,628 B2
(45) Date of Patent: Dec. 19, 2006

(54) SINGLE-WAFER TYPE HEAT TREATMENT APPARATUS FOR SEMICONDUCTOR PROCESSING SYSTEM

(75) Inventors: Kenichi Yamaga, Tokyo (JP); Ken Nakao, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 70 days.

(21) Appl. No.: 10/529,417

(22) PCT Filed: May 26, 2004

(86) PCT No.: PCT/JP2004/007572

§ 371 (c)(1),
(2), (4) Date: Mar. 30, 2005

(87) PCT Pub. No.: WO2004/114379

PCT Pub. Date: Dec. 29, 2004

(65) Prior Publication Data

US 2006/0032072 A1 Feb. 16, 2006

(30) Foreign Application Priority Data

Jun. 17, 2003 (JP) ............................ 2003-172633

(51) Int. Cl.
*F27D 5/00* (2006.01)

(52) U.S. Cl. ...................................... 432/247; 432/258

(58) Field of Classification Search ................ 432/247, 432/249, 258, 253; 118/725, 728; 219/390
See application file for complete search history.

(56) References Cited

U.S. PATENT DOCUMENTS 5,588,827 A * 12/1996 Muka ........................... 432/5
6,091,055 A * 7/2000 Naka et al. ................ 219/388
6,246,030 B1 * 6/2001 Matsuyama ................ 219/390
2002/0186967 A1 * 12/2002 Ramanan et al. .......... 392/418
2005/0211694 A1 * 9/2005 Moroz ....................... 219/390

FOREIGN PATENT DOCUMENTS

| | | |
|---|---|---|
| JP | 09-008108 | 1/1997 |
| JP | 2000-340501 | 12/2000 |
| JP | 2001-44117 | 2/2001 |
| JP | 2002-83859 | 3/2002 |
| JP | 2002-343708 | 11/2002 |
| JP | 2003-188077 | 7/2003 |

* cited by examiner

*Primary Examiner*—Gregory Wilson
(74) *Attorney, Agent, or Firm*—Oblon, Spivak, McClelland, Maier & Neustadt, P.C.

(57) ABSTRACT

A single-substrate heat-processing apparatus (2) for a semiconductor processing system includes a process container (4) configured to accommodate a target substrate (W). A support member (6) is disposed in the process container (4) and configured to support the target substrate (W) substantially in a horizontal state, while a bottom surface of the target substrate is exposed. A heating gas supply section (20) is disposed to generate a heating gas and supply the heating gas toward the bottom surface of the target substrate (W). A distribution member (16) is disposed within a flow passage of the heating gas supplied from the heating gas supply section (20), and configured to improve distribution uniformity of the heating gas onto the bottom surface of the target substrate (W).

22 Claims, 4 Drawing Sheets

SINGLE-WAFER TYPE HEAT TREATMENT APPARATUS FOR SEMICONDUCTOR PROCESSING SYSTEM

TECHNICAL FIELD

The present invention relates to a single-substrate heat-processing apparatus for heat-processing target substrates one by one in a semiconductor processing system. The term “semiconductor process” used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

BACKGROUND ART

In manufacturing semiconductor devices, a circuit pattern is transferred onto a photo-resist, using a photo lithography technique, and the photo-resist is subjected to a developing process. Where a photo lithography technique is used, it is necessary to perform, for example, a hydrophoby-providing step, resist coating step, developing step, baking step, cleaning step, etc.

As a baking step, there is a pre-baking step and a post-baking step. The pre-baking step is performed to heat and vaporize residual solvent in a resist applied on a semiconductor wafer, thereby baking and curing the resist. The post-baking step is performed to heat and vaporize residual developing solution in the resist after it is developed.

In a semiconductor processing system for performing a photo lithography technique, a plurality of process apparatuses for performing respective steps are integrated and combined to improve the operating efficiency. Heat-processing means for baking (heating means) is formed of pre-baking units and post-baking units stacked one on the other (for example, Jpn. Pat. Appln. KOKAI Publication No. 8-274015). One heat-processing unit may be commonly used for pre-baking and post-baking.

A heat-processing apparatus of this kind includes a hot plate formed of, e.g., a ceramic plate of SiC or the like with resistance heating wires built therein. On the hot plate, a semiconductor wafer having a top surface coated with a resist film is placed. Then, the semiconductor wafer is kept at e.g., about 150° C. for a predetermined time to bake and cure the resist film.

In order to ensure high accuracy in the thickness of the resist film and planar uniformity thereof, it is necessary to control temperature in heating the semiconductor wafer and planar uniformity thereof with high accuracy. For this reason, the hot plate described above is prepared to have a plurality of, e.g., ten-odd, heating zones planarly arrayed, in which thermo couples are respectively disposed. On the basis of the temperature detected by the thermo couples, heaters are independently controlled for respective heating zones.

However, where the hot plate includes a number of heating zones thus divided, which are controlled for temperature with high accuracy, a very complex structure is required, which increases the cost. Further, this complex structure remarkably increases the weight of the apparatus.

As another heat-processing apparatus, there is one in which a heating gas flows on the opposite sides of a semiconductor wafer, while the semiconductor wafer is floated by the gas (for example, Jpn. Pat. Appln. KOKAI Publication No. 2000-091249). However, in this apparatus, the heating gas blown onto a resist film affects the thickness of the resist film and planar uniformity of the thickness.

The problems described above are becoming more serious in recent years, as the wafer size increases from 200 mm to 300 mm, line width is further miniaturized, and film thickness is reduced.

DISCLOSURE OF INVENTION

An object of the present invention is to provide a heat-processing apparatus, which has a simple structure and can control the temperature of a target substrate to be planarly uniform with high accuracy.

According to a first aspect of the present invention, there is provided a single-substrate heat-processing apparatus for a semiconductor processing system, the apparatus comprising;

a process container configured to accommodate a target substrate;

a support member configured to support the target substrate substantially in a horizontal state within the process container, while a bottom surface of the target substrate is exposed;

a heating gas supply section configured to generate a heating gas and supply the heating gas toward the bottom surface of the target substrate; and a distribution member disposed within a flow passage of the heating gas supplied from the heating gas supply section, and configured to improve distribution uniformity of the heating gas onto the bottom surface of the target substrate.

The apparatus according to the first aspect may typically take the following arrangement:

The distribution member is disposed directly below the target substrate supported by the support member, and has a structure in which ventilation directions are substantially random to form a turbulent state of the heating gas.

The support member comprises a support plate having an opening slightly smaller than the target substrate, and the target substrate is placed on the support plate during a heat process such that the bottom surface is exposed from the opening.

The support plate is disposed to divide an interior of the process container into a process chamber on an upper side and a heating chamber on a lower side, and the target substrate is placed on the support plate during the heat process such that the opening is closed by the target substrate to prevent the heating gas from flowing from the heating chamber into the process chamber.

BEST MODE FOR CARRYING OUT THE INVENTION

Figure 1:
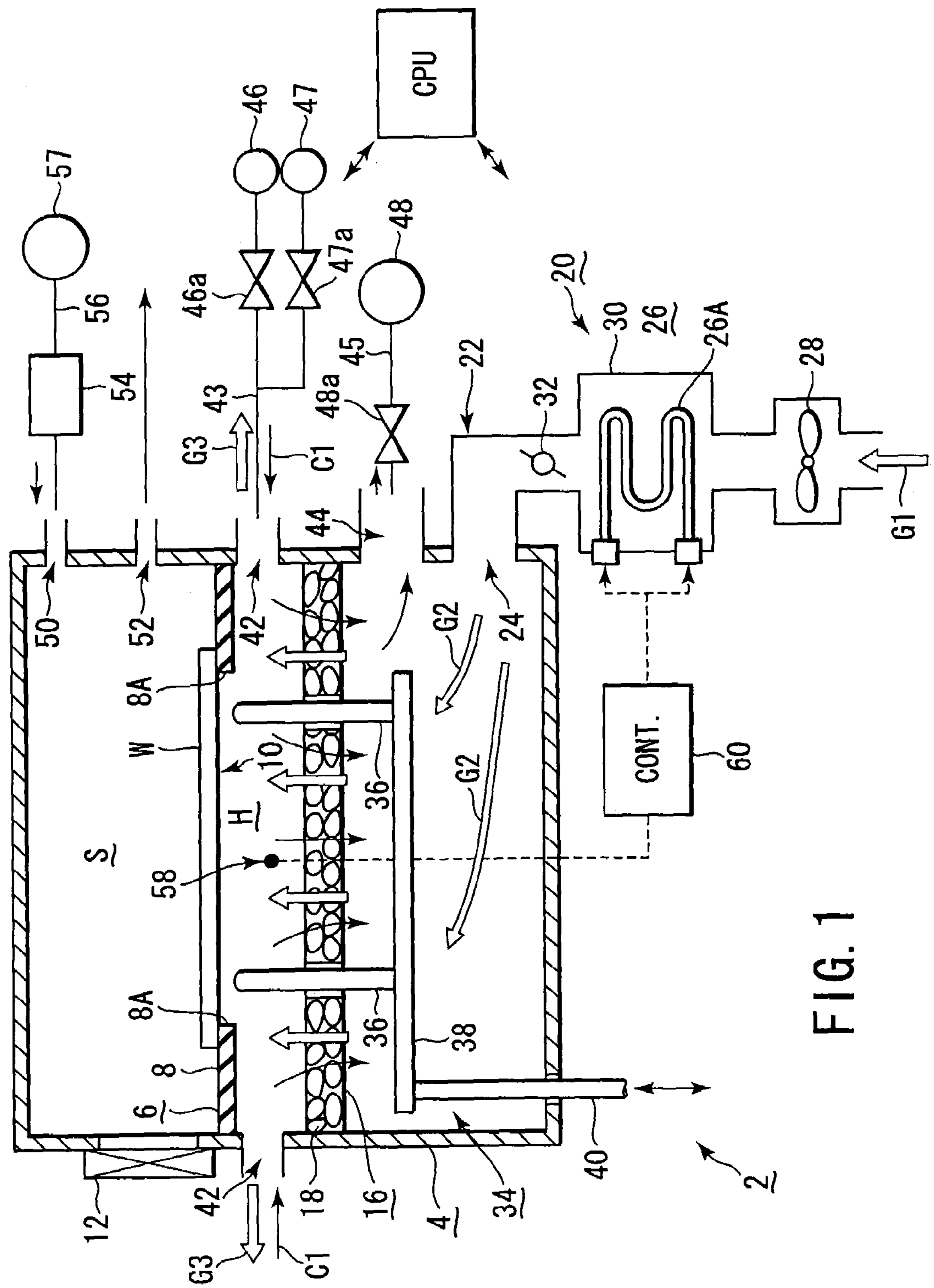
FIG. 1 is a structural view showing a single-substrate heat-processing apparatus for a semiconductor processing system according to a first embodiment of the present invention.

Embodiments of the present invention will now be described with reference to the accompanying drawings. In the following description, the constituent elements having substantially the same function and arrangement are denoted by the same reference numerals, and a repetitive description will be made only when necessary.

(First Embodiment)

Figure 2:
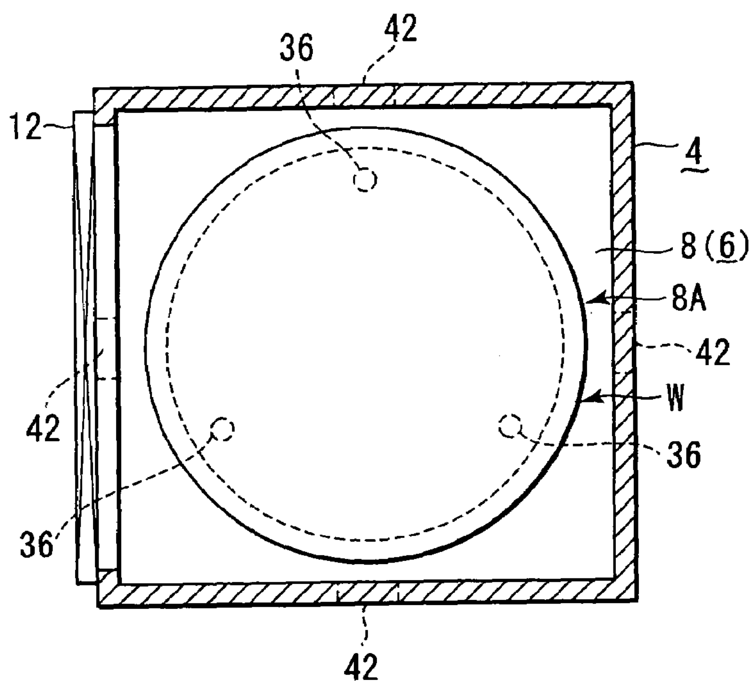
FIG. 2 is a plan view showing a support member used in the apparatus shown in FIG. 1.

FIG. 1 is a structural view showing a single-substrate heat-processing apparatus for a semiconductor processing system according to a first embodiment of the present invention. FIG. 2 is a plan view showing a support member used in the apparatus shown in FIG. 1. This apparatus is arranged to bake a photo-resist film applied on the top surface of a target substrate or semiconductor wafer.

As shown in FIG. 1, the heat-processing apparatus 2 has a process container 4 with a rectangular cross section, which is made of, e.g., aluminum and sized to accommodate a semiconductor wafer W. The interior of the process container 4 is divided into a process chamber S on the upper side and a heating chamber H on the lower side, by a support plate 8 used as a support member 6 for supporting the wafer W in a horizontal state. A door 12 is disposed on the sidewall of the process container 4 at a position corresponding to the process chamber S, and is configured to be opened and closed by, e.g., movement up and down, for transfer of the wafer W.

The support plate 8 is made of a heat resistant ceramic, such as alumina. The support plate 8 has an essentially circular opening 10 at the center. The opening 10 has a size almost the same as or larger than a region of the wafer W in which an array of semiconductor devices is to be formed. More specifically, where the wafer W has a diameter of 300 mm, the opening 10 has a diameter slightly smaller than this, e.g., smaller by about 6 mm.

When the wafer W is supported in a horizontal state at a normal position on the support plate 8, the wafer W is concentric with the opening 10, and the bottom surface of the wafer W is exposed from the opening 10. Further, in this state, the opening 10 is entirely closed by the wafer W, so the process chamber S and heating chamber H are separated on the upper and lower sides in the process container 4. The bottom surface of the rim portion of the wafer W is in face-contact with the top surface of the edge portion 8A all around, to prevent gas from diffusing between the heating chamber H on the lower side and the process chamber S on the upper side.

A distribution member 16 is disposed within the heating chamber H to improve distribution uniformity of a heating gas onto the bottom surface of the wafer W. The distribution member 16 is formed of a heat resistant porous plate 18, which is flat and faces the wafer W in parallel therewith immediately below the support plate 8 (and immediately below the wafer W). The porous plate 18 stretches all over a horizontal plane within the heating chamber H to further partition the interior of the heating chamber H into two spaces on the upper and lower sides. Accordingly, the porous plate 18 covers the entire bottom surface of the wafer W exposed from the opening 10 of the support plate 8.

The porous plate 18 has a thickness of, e.g., about 5 mm and a vacancy rate set such that the porous plate 18 does not generate a large pressure difference in the heating gas. The porous plate 18 has a structure in which ventilation directions are set substantially randomly. Accordingly, when the heating gas passes through the porous plate 18, the gas is dispersed in horizontal directions and changed into a turbulent state, and then comes into contact with the bottom surface of the wafer W in this state. As a consequence, the heating gas can uniformly come into contact with the bottom surface of the wafer W, which improves the planar uniformity of the wafer temperature.

The heat resistant porous plate 18 with random ventilation directions may be a plate made essentially of a material selected from the group consisting of a foamed ceramic, such as foamed quartz, and a porous sintered ceramic, such as porous SiC. In place of such a porous plate, the distribution member 16 may be formed of a punched metal having a number of through holes, or a fin combination in which a number of twisted short fins are planarly arrayed.

The process container 4 is connected to a heating gas supply section 20, which generates a heating gas and supplies it to the bottom surface of the wafer W. More specifically, a gas feed port 24 is formed in the sidewall of the heating chamber H and below the porous plate 18. The gas feed port 24 is connected to a heating box 30 with a heater 26 built therein, and a blower 28, through a gas feed passage 22. The heating gas may be an inactive gas, such as $N_2$ gas, or clean air.

The heater 26 is formed of a resistance heating wire 26A, such as a carbon wire, which heats a gas in contact therewith to generate the heating gas. Alternatively, for example, an arrangement may be adopted such that fillers are disposed in a heat resistant heating box 30, and a resistance heating wire 26A is disposed around the heating box 30, so that a gas flowing through the fillers is heated. This can generate a heating gas with less metal contamination.

The blower 28 is formed of, e.g., a blower fan, and sends a gas to the heating box 30, which heats the gas, and then to the heating chamber H. Where the gas is $N_2$ gas and flows under the pressure of a gas source, the blower 28 may be omitted. The downstream side of the gas feed passage 22 is provided with a flow control valve 32, which adjusts the flow passage area to control the flow rate of the heating gas.

An elevating member 34 is disposed below the wafer W to support the bottom surface of the wafer W and move the wafer W up and down. More specifically, the elevating member 34 has a plurality of, e.g., three, lifter pins 36 (FIG. 1 shows only two of them), which penetrate the distribution member 16 and are movable up and down through the opening 10. The bottoms of the lifter pins 36 are connected to, e.g., a lifter ring 38. The lifter ring 38 is connected to an actuator rod 40, which penetrates the bottom of the process container 4 and is connected to a driving source (not shown). The lifter pins 36 are moved up and down by the actuator rod 40 moving up and down, while the lifter pins 36 support the bottom surface of the wafer W at the top, so as to assist transfer of the wafer.

Since the interior of the process container 4 needs not be highly airtight, no bellows is required at the portion where the actuator rod 40 penetrates. The actuator rod 40 may be extended in a horizontal direction, and connected to a driving source (not shown) disposed outside the sidewall of the process container 4. This modification is advantageous where a plurality of heat-processing apparatuses are stacked, because their actuator rods 40 do not interfere with each other.

A plurality of gas ports 42 are formed, e.g., four ports are equidistantly formed in this example (see FIG. 2), in the sidewall of the heating chamber H and above the porous plate 18. The gas ports 42 are connected through gas lines 43 to an exhaust section 46, which exhausts the heating gas after it heats the wafer W. The gas lines 43 are also connected to a cooling gas supply section 47, which supplies a cooling gas for cooling the heated wafer W. Switching valves 46*a* and 47*a* are provided for the exhaust section 46 and cooling gas supply section 47, respectively, and are operated in accordance with a program for baking a photo-resist film, which is stored in the CPU of the heat-processing apparatus 2.

The number of gas ports 42 is not limited to four, and the process container 4 may be provided with two, three, five, or more gas ports disposed at, e.g., regular internals in an angular direction. In any case, they are preferably arranged to uniformly exhaust a heating gas, and to feed a cooling gas. The cooling gas may be clean air taken therein at an ambient room temperature, or clean air or an inactive gas cooled in advance.

An exhaust port 44 is formed in the sidewall of the heating chamber H and below the porous plate 18, to exhaust the cooling gas. The exhaust port 44 is connected through an exhaust line 45 to an exhaust section 48, which exhausts the cooling gas after it cools the wafer W. A switching valve 48*a* is provided for the exhaust section 48, and is operated in accordance with a program stored in the CPU (it is closed when the wafer W is heated). The exhaust sections 46 and 48 are connected to a factory exhaust duct or the like.

It should be noted that the term "exhaust section" used in this specification includes not only a member having a forcible exhaust function, such as a pump or fan, but also a simpler member, such as piping for exhaust gas connected to a factory exhaust duct.

A gas feed port 50 for supplying a gas and an exhaust port 52 for exhausting the gas are formed in the sidewall of the process chamber S. The gas feed port 50 is connected to a gas supply section 57 through a line 56 provided with a flow regulator 54, such as a mass-flow controller. An inactive gas, such as $N_2$ gas, or clean air is supplied from the gas supply section 57 into the process chamber S at a controlled flow rate. It may be arranged to directly supply ambient clean gas through the gas feed port 50.

The exhaust port 52 is connected to, e.g., a factory exhaust duct, so that the atmosphere inside the process chamber S is naturally exhausted. An exhaust fan may be disposed at the exhaust port 52 to perform forcible exhaust.

A temperature detector 58, such as a thermo couple, is disposed directly below the semiconductor wafer W, to detect the temperature of the heating gas, which has passed through the porous plate 18 and flows upward in a turbulent state. Based on the value detected by the temperature detector 58, a heating gas control section 60 formed of, e.g., a micro-computer adjusts the electrical power applied to the resistance heating wire 26A, thereby controlling the temperature of the heating gas. The heating gas control section 60 operates in cooperation with the CPU of the heat-processing apparatus 2.

Next, an explanation will be given of an operation of the heat-processing apparatus 2 according to the first embodiment described above. The operation described below is performed in accordance with a program for baking a photo-resist film, which is stored in the CPU of the heat-processing apparatus 2.

First, a semiconductor wafer W with a photo-resist film applied on the surface is transferred by the transfer arm (not shown) into the process chamber S of the process container 4 through the opened door 12. Then, the lifter pins 36 are moved up to receive the wafer W by them. Thereafter, the transfer arm is retreated, and the lifter pins 36 are moved down to place the wafer W on the support plate 8, as shown in FIG. 1.

As shown in FIG. 1, when the wafer W is supported in a horizontal state at the normal position on the support plate 8, the wafer W is concentric with the opening 10, and the bottom surface of the wafer W is exposed from the opening 10. Further, in this state, the opening 10 is entirely closed by the wafer W, so the process chamber S and heating chamber H are separated on the upper and lower sides in the process container 4. The bottom surface of the rim portion of the wafer W is in face-contact with the top surface of the edge portion 8A all around, to prevent gas from diffusing between the heating chamber H on the lower side and the process chamber S on the upper side.

Then, the blower 28 of the heating gas supply section 20 is activated to supply a gas G1, such as clean air, or an inactive gas, e.g., $N_2$ gas. The gas G1 is heated by the resistance heating wire 26A of the heater 26 within the heating box 30, up to a predetermined temperature, and is supplied as a heating gas G2 to the bottom side within the heating chamber H through the gas feed port 24. The heating gas G2 flows upward while diffusing within the heating chamber H, and passes through the porous plate 18 of the distribution member 16 with high permeability, and then comes into contact with the bottom surface of the wafer W to heat up the wafer W.

Since the ventilation directions of the porous plate 18 are set in all directions, the heating gas is changed into a turbulent state when passing through the porous plate 18, and then comes into contact with the bottom surface of the wafer W in this state. As a consequence, the wafer W is heated to a temperature with high planar uniformity.

At this time, the opening 10 of the support plate 8 is entirely closed by the wafer W, so the process chamber S and heating chamber H are separated on the upper and lower sides in the process container 4. The heating gas is thus prevented from diffusing from the heating chamber H into the process chamber S, so that the heating gas cannot come into direct contact with the photo-resist film applied onto the top surface of the wafer W. As a consequence, the photo-resist film is not affected by the heating gas.

After coming into direct contact with the bottom surface of the wafer W, the heating gas is exhausted as an exhaust gas G3 through the gas ports 42 formed in the sidewall of the heating chamber H. The exhaust gas G3 flows through the line 43 and exhaust section 46, and is eventually discharged outside through a factory exhaust duct or the like. At this time, the switching valve 46*a* for the exhaust section 46 is opened, while the switching valves 47*a* and 48*a* for the cooling gas are closed. Since a plurality of gas ports 42 are formed along the periphery of the process container 4, the heating gas is exhausted without large drifts. As a consequence, the wafer is prevented from been affected in terms of the planar uniformity of temperature.

The temperature of the wafer W in baking is set to be within a range of, e.g., from 90 to 250° C. The temperature of the heating gas having passed through the porous plate 18 is detected by the thermo couple or temperature detector 58.

Based on the detected value, the heating gas control section 60 controls the electrical power applied to the resistance heating wire 26A. As a consequence, the temperature of the heating gas is maintained at a predetermined constant temperature within a range of from 90 to 250° C., e.g., 150° C.

The wafer W is subjected to the heat process (baking) described above for a predetermined time, e.g., about 90 seconds, and the photo-resist film is thereby baked and cured. During this heat process, a gas, such as an inactive gas, e.g., $N_2$ gas, or clean air, is supplied into the process chamber S on the upper side of the wafer W. This gas is exhausted, along with a solvent gas generated from the photo-resist film, through the exhaust port 52 into a factory exhaust duct, by natural exhaust or forcible exhaust using a fan.

The flow rate of the gas supplied into the process chamber S is controlled by the flow regulator 54, so that the atmosphere inside the process chamber S is kept at essentially constant values of temperature and humidity. At this time, the interior of the process chamber S is set at a pressure slightly positive by, e.g., about 50 Pa, relative to the heating chamber H on the lower side. As a consequence, the heating gas is reliably prevented from flowing into the process chamber S.

After the heat process described above for baking and curing the photo-resist film is finished, a cooling step starts. In this step, at first, the electric power supply to the resistance heating wire 20A is stopped, and the flow control valve 32 within the gas feed passage 22 is closed, to stop supply of the heating gas G2. At the same time, the switching valve 46*a* for the exhaust section 46 is closed, while the switching valves 47*a* and 48*a* for the cooling gas are opened.

With this change, the cooling gas C1 starts being supplied through the gas ports 42, through which the heating gas was exhausted until now. The cooling gas C1 flows into the heating chamber H below the bottom surface of the wafer W, and cools the wafer W from the bottom. The cooling gas thus used passes through the porous plate 18 downward to the exhaust port 44. Then, the cooling gas used flows through the line 45 and exhaust section 48, and is eventually discharged outside through a factory exhaust duct or the like.

The cooling gas may be exhausted through the line 45, not by vacuum-exhaust using the exhaust section 48, but by natural exhaust using a factory exhaust duct. An exhaust fan may be disposed at the exhaust port 44 to perform forcible exhaust. The cooling gas supplied through the gas ports 42 may be clean air at an ambient room temperature, or a cooling gas actively cooled to a low temperature.

According to the first embodiment, the wafer W can be subjected to a heat process while being set at a temperature with high planar uniformity, without a complicated heating control using a plurality of heating zones, as described in the conventional heat-processing apparatus. Since the heating gas supply section for generating the heating gas has a simple structure, the entire arrangement of the apparatus can be simplified, thereby reducing the cost that much.

Further, the top surface of the wafer W is not exposed to the heating gas flowing or blowing thereon. As a consequence, the photo-resist film, which can be easily affected by, e.g., external factors, is baked and cured without receiving ill effects, so that the photo-resist film can have an improved uniformity of the thickness.

In the structure shown in FIG. 1, the gas feed port 24 is formed in a lower portion of the sidewall of the process container 4. Alternatively, a gas feed port 24 may be disposed near the center of the bottom of the process container 4 to promote distribution of the heating gas.

Figure 3:
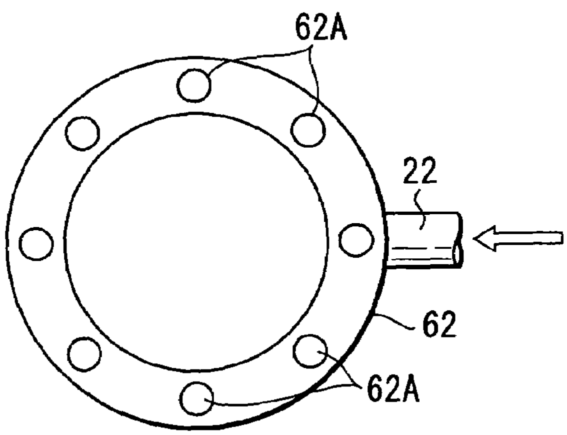
FIG. 3 is a plan view showing a gas spouting pipe having a ring shape used in a modification of the apparatus shown in FIG. 1.

In place of the gas feed port 24, a gas spouting pipe having a ring shape connected to the gas feed passage 22 may be used. FIG. 3 is a plan view showing a gas spouting pipe having a ring shape used in a modification of the apparatus shown in FIG. 1. In the modification shown in FIG. 3, a gas spouting pipe 62 having a ring shape connected to the gas feed passage 22 is disposed on the bottom of the heating chamber H. The gas spouting pipe 62 is provided with a number of gas spouting holes 62A formed thereon, from which the heating gas is spouted. The modification shown in FIG. 3 can further promote distribution of the heating gas.

(Second Embodiment)

Figure 5:
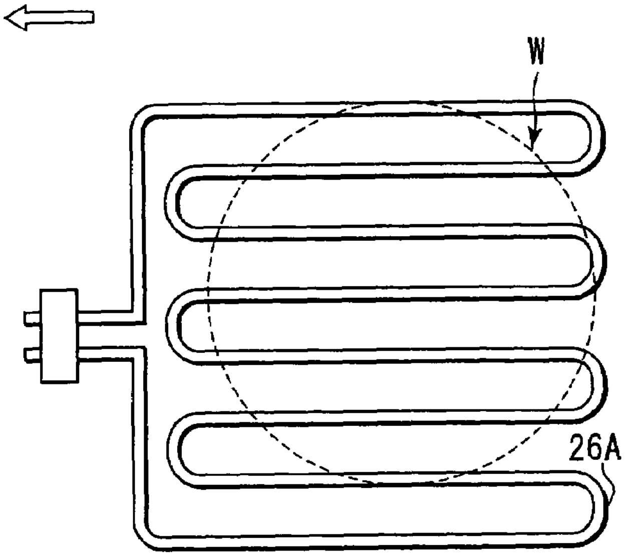
FIG. 5 is a plan view showing a resistance heating wire used in the apparatus shown in FIG. 4.
Figure 4:
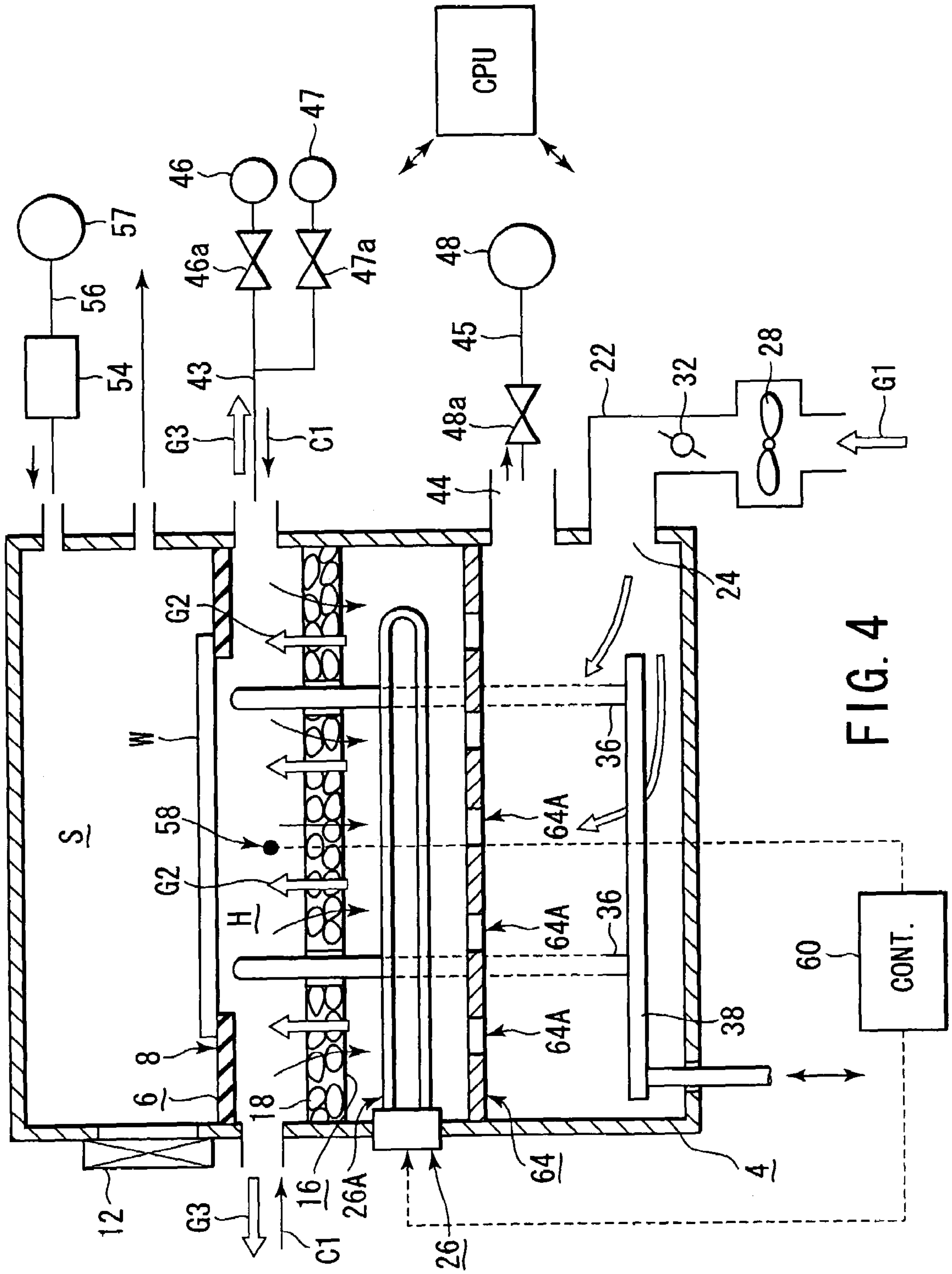
FIG. 4 is a structural view showing a single-substrate heat-processing apparatus for a semiconductor processing system according to a second embodiment of the present invention.

FIG. 4 is a structural view showing a single-substrate heat-processing apparatus for a semiconductor processing system according to a second embodiment of the present invention. FIG. 5 is a plan view showing a resistance heating wire used in the apparatus shown in FIG. 4. In the first embodiment shown in FIG. 1, the heater 26 of the heating gas supply section 20 is disposed outside the process container 4 and on the middle of the gas feed line 22. The heater 26, however, may be disposed within the process container 4. The apparatus according to the second embodiment is arranged on the basis of this idea.

As shown in FIG. 4, the apparatus according to the second embodiment includes a heater 26 with a resistance heating wire 26A horizontally disposed directly below a porous plate 18. As shown in FIG. 5, the resistance heating wire 26A is planarly extended, e.g., in a meandering state, to cover substantially the entire bottom surface of the wafer W exposed from the opening 10 of the support plate 8.

Further, an auxiliary distribution member 64 is disposed directly below the resistance heating wire 26A, to improve distribution uniformity of a supplied gas. The auxiliary distribution member 64 is formed of, e.g., a punched metal with a plurality of through holes 64A uniformly distributed in a plane. A gas G1 to be heated is take into from a gas feed port 24, and is essentially uniformly distributed by the auxiliary distribution member 64, when it flows to the resistance heating wire 26A.

The auxiliary distribution member 64 is not limited to a punched metal, and it may be a member similar to the porous plate 18 disposed thereabove, e.g., a foamed quartz plate with a small thickness and high permeability. It should be noted that any of the modifications described in relation to the first embodiment can be applied to the second embodiment.

The second embodiment provides the same operations and effects as those of the first embodiment. Specifically, for example, the wafer W can be subjected to a heat process while being set at a temperature with high planar uniformity, without a complicated heating control using a plurality of heating zones, as described in the conventional heat-processing apparatus. Since the heating gas supply section for generating the heating gas has a simple structure, the entire arrangement of the apparatus can be simplified, thereby reducing the cost that much.

Further, the top surface of the wafer W is not exposed to the heating gas flowing or blowing thereon. As a consequence, the photo-resist film, which can be easily affected by, e.g., external factors, is baked and cured without receiving ill effects, so that the photo-resist film can have an improved uniformity of the thickness.

According to the second embodiment, since the heater 26 is disposed within the process container 4, heating becomes more efficient. Further, the auxiliary distribution member 64 is disposed directly below the resistance heating wire 26A of the heater 26. This promotes distribution of the supplied gas G1, thereby further improving planar uniformity of the wafer temperature. Incidentally, the auxiliary distribution member 64 may be disposed in the heat-processing apparatus according to the first embodiment. In addition, when the wafer W is cooled, residual heat of the resistance heating wire 26A is discharged downward by the cooling gas. As a consequence, the residual heat of the resistance heating wire 26A is prevented from affecting the efficiency of cooling the wafer W.

In FIG. 4, the gas feed port 24 and exhaust port 44 are respectively formed in the sidewall of the process container 4 below the porous plate 18. However, an arrangement may be adopted such that only one of these ports, e.g., gas feed port 24, is formed, and the exhaust line 45 is branched from the gas feed line 22 connected to the port 24. This structural modification may be also applied to the first embodiment shown in FIG. 1.

(Third Embodiment)

Figure 6:
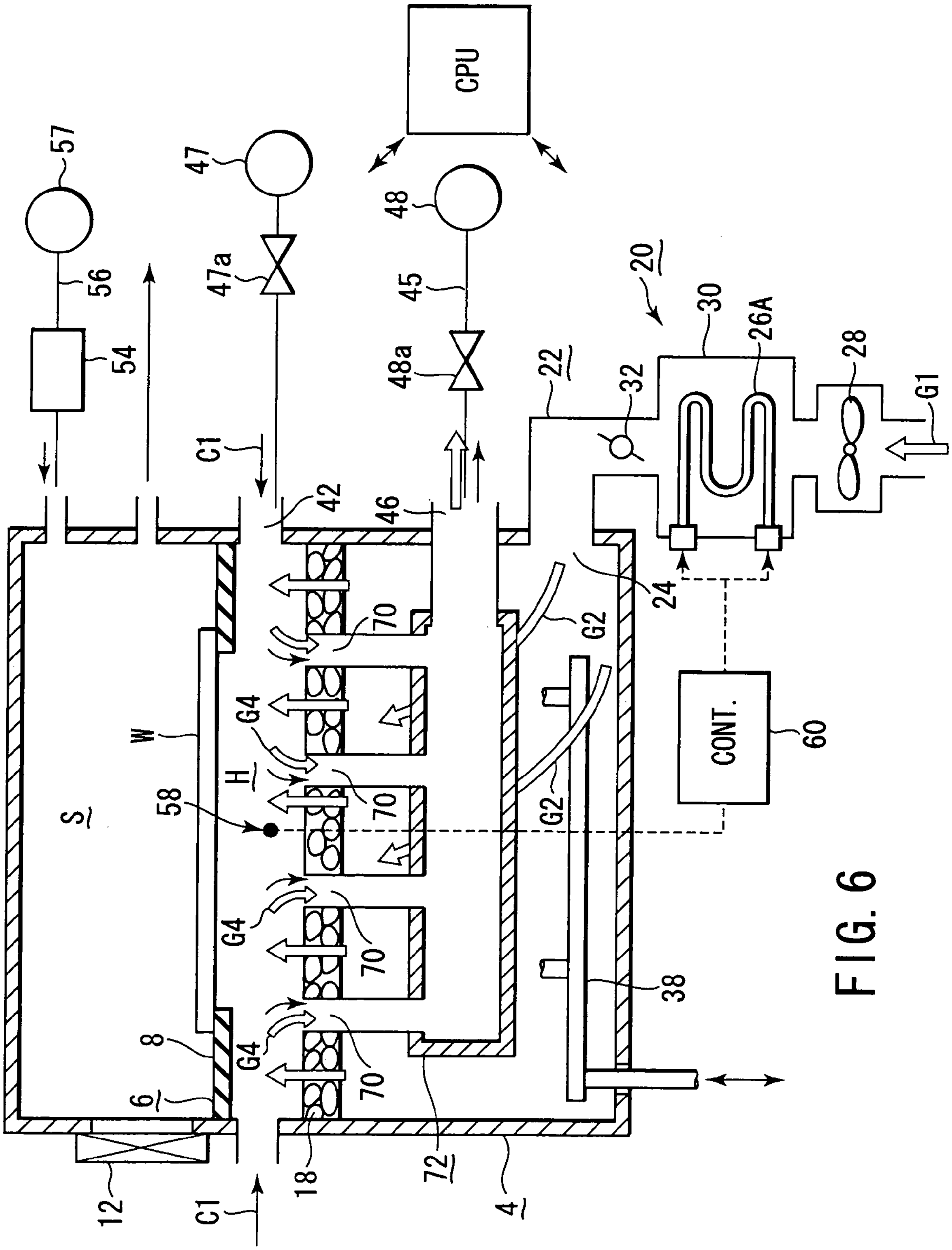
FIG. 6 is a structural view showing a single-substrate heat-processing apparatus for a semiconductor processing system according to a third embodiment of the present invention.

FIG. 6 is a structural view showing a single-substrate heat-processing apparatus for a semiconductor processing system according to a third embodiment of the present invention. In the first and second embodiments shown in FIGS. 1 and 4, after coming into contact with the bottom surface of the wafer W, the heating gas flows horizontally outward in the radial direction of the wafer W, and is exhausted directly out of the process container 4 through the gas ports 42 formed in the sidewall of the container. However, an arrangement may be adopted such that, after coming into contact with the bottom surface of the wafer W, the heating gas turns round downward and is exhausted. The apparatus according to the third embodiment is arranged on the basis of this idea.

As shown in FIG. 6, the apparatus according to the third embodiment includes a plurality of exhaust pipes 70 disposed at intervals in the horizontal plane of a flat porous plate 18 constituting a distribution member 16. Each of the exhaust pipes 70 is formed of, e.g., an aluminum pipe having an inner diameter of about 10 mm, which perpendicularly penetrates the horizontal porous plate 18. The bottoms of the exhaust pipes 70 are connected to a gas collecting head 72, which is formed of a hollow circular plate made of, e.g., aluminum, and disposed within a lower portion of the process container 4. The gas collecting head 72 is connected on one side to an exhaust line 45 penetrating the sidewall of the container. In order not to interfere with the heating gas flowing upward within the heating chamber H, the gas collecting head 72 is preferably set to have a relatively small diameter.

According to the third embodiment, the heating gas G2 supplied into the heating chamber H is changed into a turbulent state when passing through the porous plate 18 upward, and then comes into contact with the bottom surface of the wafer W. Thereafter, the heating gas turns round downward and flows as a backward heating gas G4 down through the exhaust pipes 70 nearby and into the gas collecting head 72. The gas collected in the gas collecting head 72 is discharged outside through the exhaust line 45. While the wafer is subjected to the heat process, the gas ports 42 are kept closed, so that no heating gas flows out through the gas ports 42.

After the heat process, the gas ports 42 are opened to supply the cooling gas therethrough when a cooling step is performed. The cooling gas flows onto the bottom surface of the wafer W to cool the wafer W, and is then discharged outside through the exhaust pipes 70, gas collecting head 72, and line 45, as in the heating gas. It should be noted that any of the modifications described in relation to the first and second embodiments can be applied to the third embodiment.

The third embodiment provides the same operations and effects as those of the first embodiment. Specifically, for example, the wafer W can be subjected to a heat process while being set at a temperature with high planar uniformity, without a complicated heating control using a plurality of heating zones, as described in the conventional heat-processing apparatus. Since the heating gas supply section for generating the heating gas has a simple structure, the entire arrangement of the apparatus can be simplified, thereby reducing the cost that much.

Further, the top surface of the wafer W is not exposed to the heating gas flowing or blowing thereon. As a consequence, the photo-resist film, which can be easily affected by, e.g., external factors, is baked and cured without receiving ill effects, so that the photo-resist film can have an improved uniformity of the thickness.

According to the third embodiment, the heating gas comes into contact with the bottom surface of the wafer W, and is then exhausted through a number of exhaust pipes 70 distributed in the porous plate 18 and the gas collecting head 72. As a consequence, the heating gas is exhausted uniformly in the horizontal direction below the wafer W, which further improves the planar uniformity of the wafer temperature.

The first to third embodiments are exemplified by a case where a heat process is used for a photo-resist film applied on the top surface of a wafer W to be baked and cured by the heat process (baking). The present invention may be applied to another heat process. The target substrate is not limited to a semiconductor wafer, and the present invention may be applied to a glass substrate for an LCD or FPD, or another material substrate.

INDUSTRIAL APPLICABILITY

According to the present invention, there is provided a heat-processing apparatus, which has a simple structure and can control the temperature of a target substrate to be planarly uniform with high accuracy.

The invention claimed is:

1. A single-substrate heat-processing apparatus for a semiconductor processing system, the apparatus comprising;

- a process container configured to accommodate a target substrate;
- a support member configured to support the target substrate substantially in a horizontal state within the process container, while a bottom surface of the target substrate is exposed;
- a heating gas supply section configured to generate a heating gas and supply the heating gas toward the bottom surface of the target substrate; and
- a distribution member disposed within a flow passage of the heating gas supplied from the heating gas supply section, and configured to improve distribution uniformity of the heating gas onto the bottom surface of the target substrate, wherein the distribution member is disposed directly below the target substrate supported by the support member, and has a structure in which ventilation directions are substantially random to form a turbulent state of the heating gas.

2. The heat-processing apparatus according to claim 1, wherein the distribution member comprises a heat resistant porous plate consisting essentially of a material selected from the group consisting of foamed ceramics and porous sintered ceramics.

3. The heat-processing apparatus according to claim 2, wherein the porous plate consists essentially of foamed quartz.

4. The heat-processing apparatus according to claim 1, wherein the support member comprises a support plate having an opening slightly smaller than the target substrate, and the target substrate is placed on the support plate during a heat process such that the bottom surface is exposed from the opening.

5. The heat-processing apparatus according to claim 4, wherein the support plate is disposed to divide an interior of the process container into a process chamber on an upper side and a heating chamber on a lower side, and the target substrate is placed on the support plate during the heat process such that the opening is closed by the target substrate to prevent the heating gas from flowing from the heating chamber into the process chamber.

6. The heat-processing apparatus according to claim 5, further comprising an exhaust passage for exhausting the heating gas from the heating chamber.

7. The heat-processing apparatus according to claim 6, wherein the exhaust passage comprises a plurality of exhaust pipes disposed at intervals in a horizontal plane and penetrate the distribution member.

8. The heat-processing apparatus according to claim 6, further comprising a gas supply section configured to supply a gas into the process chamber, and the process chamber is set to have a positive pressure relative to the heating chamber during the heat process.

9. The heat-processing apparatus according to claim 5, further comprising an elevating member configured to support and move the target substrate up and down from the bottom surface, the elevating member being movable up and down through the opening.

10. The heat-processing apparatus according to claim 1, wherein the heating gas supply section comprises a heater configured to heat a gas to generate the heating gas, and a blower configured to send the gas to the heater.

11. The heat-processing apparatus according to claim 10, wherein the heater is disposed directly below the distribution member.

12. The heat-processing apparatus according to claim 10, wherein the heater comprises a heating portion covering substantially all over the exposed bottom surface of the target substrate.

13. The heat-processing apparatus according to claim 12, further comprising an auxiliary distribution member disposed between the blower and the heater, and configured to improve distribution uniformity of the gas supplied from the blower onto the heater.

14. The heat-processing apparatus according to claim 1, further comprising a temperature detector configured to detect temperature of the heating gas near the bottom surface of the target substrate, and a heating gas control section configured to control the heating gas supply section in accordance with a detected value obtained by the temperature detector.

15. The heat-processing apparatus according to claim 1, further comprising a cooling gas supply section configured to supply a cooling gas onto the bottom surface of the target substrate, and a process control section configured to selectively supply the heating gas and the cooling gas.

16. The heat-processing apparatus according to claim 15, wherein the process control section is set to perform baking on a photo-resist film applied on a top surface of the target substrate.

17. A single-substrate heat-processing apparatus for a semiconductor processing system, the apparatus comprising;

a process container configured to accommodate a target substrate;

a support member configured to support the target substrate substantially in a horizontal state within the process container, while a bottom surface of the target substrate is exposed;

a heating gas supply section configured to generate a heating gas and supply the heating gas toward the bottom surface of the target substrate; and a distribution member disposed within a flow passage of the heating gas supplied from the heating gas supply section, and configured to improve distribution uniformity of the heating gas onto the bottom surface of the target substrate, wherein the support member comprises a support plate having an opening slightly smaller than the target substrate, and the target substrate is placed on the support plate during a heat process such that the bottom surface is exposed from the opening, wherein the support plate is disposed to divide an interior of the process container into a process chamber on an upper side and a heating chamber on a lower side, and the target substrate is placed on the support plate during the heat process such that the opening is closed by the target substrate to prevent the heating gas from flowing from the heating chamber into the process chamber, and wherein the apparatus further comprises an exhaust passage for exhausting the heating gas from the heating chamber, and the exhaust passage comprises a plurality of exhaust pipes disposed at intervals in a horizontal plane and penetrate the distribution member.

18. The heat-processing apparatus according to claim 17, wherein the distribution member is disposed directly below the target substrate supported by the support member, and has a structure in which ventilation directions are substantially random to form a turbulent state of the heating gas.

19. The heat-processing apparatus according to claim 18, wherein the distribution member comprises a heat resistant porous plate consisting essentially of a material selected from the group consisting of foamed ceramics and porous sintered ceramics.

20. The heat-processing apparatus according to claim 19, wherein the porous plate consists essentially of foamed quartz.

21. The heat-processing apparatus according to claim 17, further comprising a gas supply section configured to supply a gas into the process chamber, and the process chamber is set to have a positive pressure relative to the heating chamber during the heat process.

22. The heat-processing apparatus according to claim 17, comprising a process control section set to perform baking on a photo-resist film applied on a top surface of the target substrate.

* * * * *